United States Patent
Wu

(10) Patent No.: US 9,153,292 B2
(45) Date of Patent: Oct. 6, 2015

(54) INTEGRATED CIRCUIT DEVICES HAVING MEMORY AND METHODS OF IMPLEMENTING MEMORY IN AN INTEGRATED CIRCUIT DEVICE

(71) Applicant: Xilinx, Inc., San Jose, CA (US)

(72) Inventor: Ephrem C. Wu, San Mateo, CA (US)

(73) Assignee: XILINX, INC., San Jose, CA (US)

( * ) Notice: Subject to any disclaimer, the term of this patent is extended or adjusted under 35 U.S.C. 154(b) by 103 days.

(21) Appl. No.: 13/789,313

(22) Filed: Mar. 7, 2013

(65) Prior Publication Data

US 2014/0254232 A1    Sep. 11, 2014

(51) Int. Cl.
*G11C 7/00* (2006.01)
*G11C 5/06* (2006.01)
*H03K 19/177* (2006.01)

(52) U.S. Cl.
CPC .............. *G11C 5/06* (2013.01); *H03K 19/1776* (2013.01)

(58) Field of Classification Search
CPC .................................. G11C 7/00; G11C 11/40
USPC ..................................... 365/72, 219
See application file for complete search history.

(56) References Cited

U.S. PATENT DOCUMENTS

| | | | |
|---|---|---|---|
| 6,072,741 A * | 6/2000 | Taylor | ............................. 365/219 |
| 6,404,225 B1 | 6/2002 | Rangasayee | |
| 6,467,017 B1 | 10/2002 | Ngai et al. | |
| 6,590,259 B2 | 7/2003 | Adkisson et al. | |
| 2009/0072856 A1 | 3/2009 | Subramaniam et al. | |
| 2013/0141962 A1 * | 6/2013 | Liaw | ............................. 365/154 |

OTHER PUBLICATIONS

Iyer, S. et al., "Designing Packet Buffers for Router Linecards", IEEE/ACM Transactions on Networking, vol. 16, No. 3, Jun. 2008, pp. 705-717, Palo Alto, CA US.

* cited by examiner

*Primary Examiner* — Son Mai
*Assistant Examiner* — Muna Techane
(74) *Attorney, Agent, or Firm* — John J. King

(57) ABSTRACT

An integrated circuit device having memory is disclosed. The integrated circuit device comprises programmable resources; programmable interconnect elements coupled to the programmable resources, the programmable interconnect elements enabling a communication of signals with the programmable resources; a plurality of memory blocks; and dedicated interconnect elements coupled to the plurality of memory blocks, the dedicated interconnect elements enabling access to the plurality of memory blocks. A method of implementing memory in an integrated circuit device is also disclosed.

20 Claims, 10 Drawing Sheets

INTEGRATED CIRCUIT DEVICES HAVING MEMORY AND METHODS OF IMPLEMENTING MEMORY IN AN INTEGRATED CIRCUIT DEVICE

FIELD OF THE INVENTION

The present invention relates generally to integrated circuit devices, and in particular, to an integrated circuit device having memory and a method of implementing memory in an integrated circuit device.

BACKGROUND OF THE INVENTION

The use of memory is an important aspect of almost any electronic device. There are different types of memory. For example, volatile memory is a type of memory which will retain values stored in the memory only when power is applied to the memory. When power is removed, the data stored in the memory will be lost over some period of time. In contrast, non-volatile memory is a type of memory whose data is not affected when power is removed.

Different types of memory elements may have different properties. For example, memory elements may have different access times, power consumption, immunity to the effects of radiation, etc. Accordingly, memories can be selected not only based upon a desired operation of the memory, but operational qualities of a memory.

Depending upon the functionality or operational qualities of the memory, a memory may be included on an integrated circuit device, or implemented separate from the integrated circuit device and accessed by the integrated circuit device. Providing a memory separate from an integrated circuit device may affect the operation of the overall circuit implementing the memory. Accordingly, there are various considerations when selecting both the type of memory and the locations of memory when implementing memory associated with an integrated circuit device.

SUMMARY OF THE INVENTION

An integrated circuit device having memory is described. The integrated circuit device comprises programmable resources; programmable interconnect elements coupled to the programmable resources, the programmable interconnect elements enabling a communication of signals with the programmable resources; a plurality of memory blocks; and dedicated interconnect elements coupled to the plurality of memory blocks, the dedicated interconnect elements enabling access to the plurality of memory blocks.

An integrated circuit device having memory according to an alternate arrangement comprises a dynamic random access memory (DRAM) block having a plurality of channels; a plurality of memory blocks; and dedicated interconnect elements coupled between the DRAM block and the plurality of memory blocks, the dedicated interconnect elements enabling routing data from any of the plurality of channels of the DRAM block to selected memory blocks of the plurality of memory blocks.

A method of implementing memory in an integrated circuit device is also described. The method comprises implementing programmable resources coupled to programmable interconnect elements, the programmable interconnect elements enabling a communication of signals with the programmable resources; providing a plurality of memory blocks; and coupling dedicated interconnect elements to the plurality of memory blocks, the dedicated interconnect elements enabling access to the plurality of memory blocks.

DETAILED DESCRIPTION OF THE DRAWINGS

Figure 1:
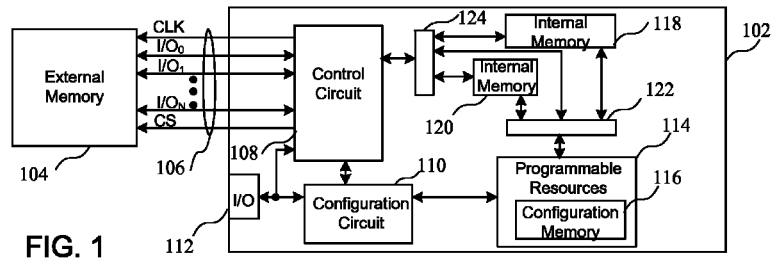
FIG. 1 is a block diagram of an integrated circuit coupled to an external memory.

Turning first to FIG. 1, a block diagram of an integrated circuit coupled to an external memory is shown. In particular, an integrated circuit device 102 is coupled to an external memory 104 by way of communication links 106. The integrated circuit device could be any type of integrated circuit device, such as an application specific integrated circuit (ASIC) or an integrated circuit device having programmable resources, as will be described in more detail below. The integrated circuit device 102 comprises a control circuit 108 coupled to a configuration circuit 110. The configuration circuit 110 may receive configuration data from the external memory 104 by way of the control circuit 108, or by way of an input/output (I/O) port 112. The configuration circuit 110 is used to configure the programmable resources 114 of the integrated circuit device by providing configuration data to the configuration memory 116. Alternatively, the configuration data could be provided to the configuration memory directly by the control circuit 108. The control circuit 108 and the programmable resources 114 may also be coupled to internal memory 118 and 120. Further, the integrated circuit device may optionally include dedicated interconnect elements 122 and 124, separate from interconnect elements associated with the programmable resources 114, for enabling access to the memory elements.

As will be described in more detail below, the internal memory 118 and 120 may be different types of memory and may be arrays of different sizes. For example, for conventional devices which may have a lookup table (LUT) random access memories (RAMs) and block RAMs (BRAMs) (e.g. 36 kilobit (Kb) blocks) associated with programmable resources in the memory hierarchy, the next levels in the memory hierarchy include external SRAMs and DRAMs. Various circuit implementations set forth below include an extra level in the memory hierarchy between the small BRAMs and the external SRAMs or DRAMs. This extra level of SRAMs, which may be configured as networked SRAMs, may be on-chip SRAMs that are deeper than the BRAMs, but small enough to fit on the FPGA die as will be described in more detail below. These networked SRAMs assist external memories to increase overall system performance, and allow users to better associate SRAM bandwidth with SRAM capacity.

Figure 2:
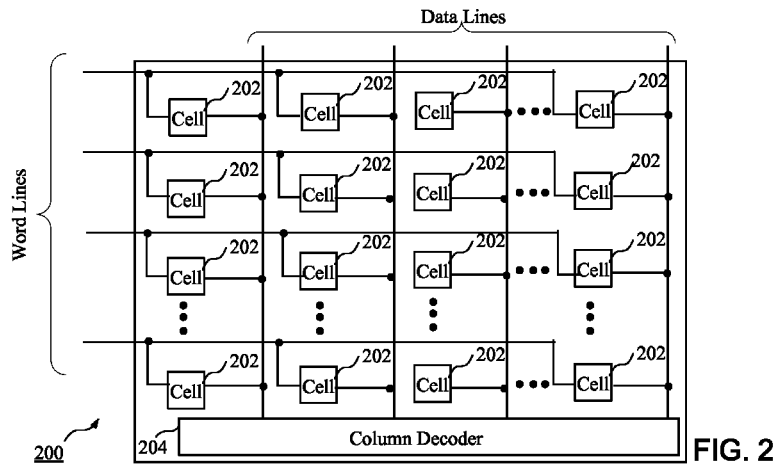
FIG. 2 is a block diagram of a static random access memory (SRAM) block.

Turning now to FIG. 2, a block diagram of an SRAM block 200 is shown. The SRAM block 200 of FIG. 2 may be a portion of the internal memory 118, while the internal memory 120 may be a DRAM block, for example, which will be described in more detail below in reference to FIGS. 4 and 5. The SRAM block 200 comprises a plurality of individual memory cells 202, which may be arranged in a matrix. Columns of memory cells and a column decoder 204 are coupled to data lines and rows of memory cells are coupled to word lines to generate output data as an output of the DRAM. Accordingly, to write data to a cell, a word line associated with the cell is pulled high, and the desired data is coupled to the data line associated with the cell. To read data from a cell, the word line associated with a cell is pulled high, and the column decoder generates output values associated with the column in which the cell is located.

Figure 3:
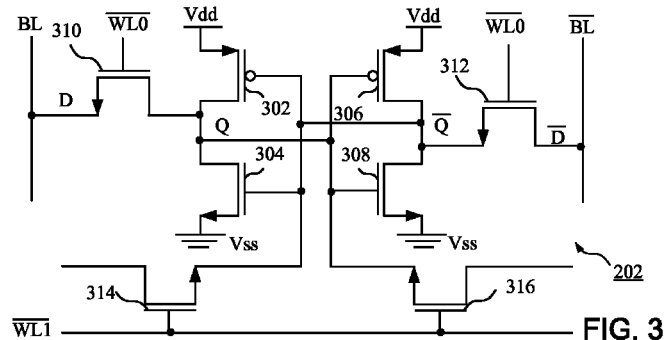
FIG. 3 is a circuit diagram of a memory cell of the SRAM block of FIG. 2.

Turning now to FIG. 3, a circuit diagram of a memory cell of the SRAM memory block of FIG. 2 is shown. The memory cell includes an inverter having a p-channel transistor 302 with a source coupled to a reference power voltage, such as Vdd, and a drain coupled at a first node "Q" to a drain of an n-channel transistor 304, the source of which is coupled to a ground potential (Vss). The memory cell includes a second inverter having a p-channel transistor 306 with a source coupled to the reference voltage and a drain coupled at a second node "Q_b" to a drain of an n-channel transistor 308, the source of which is also coupled to ground. The first node "Q" is controlled by an n-channel transistor 310 coupled to receive an inverted word line (WL0_bar) signal at its gate which controls the receipt of input data on a bit line (BL) at the first node. The second node "Q_b" is controlled by another n-channel transistor 312 coupled to receive the inverted word line signal at its gate which controls the receipt of inverted input data at the second node Q_b. Transistors 314 and 316 are configured to enable separate inverted word lines WL0_bar and WL1_bar. The transistors 314 and 316 are configured as shown to have the source coupled to the Q and Q_b nodes as shown, where the gates are each controlled by the inverted WL1_bar, enabling a dual ported SRAM. When an inverted word line (WL0_bar) is selected for a given cell, the values on the bit line and inverted bit line are coupled to the Q and Q_b nodes, where the data value for the cell is stored. The data can then be accessed by the WL1_bar signal, enabling dual port memory elements. More particularly, the SRAM cells can be implemented with just one read and one write port. Unlike some SRAM cells which provide 2 read/write (w/r) ports, either of which can be used for reading or writing, memory density can be increased by including just one read port and one write port. By providing one port for reading and one port for writing, the 8T SRAM cell of FIG. 3 can operate twice as fast as a cell having 2 w/r ports by enabling accessing the memory on half clock cycles (i.e. the rising and falling edges of the clock). While the memory cell of FIG. 3 is shown by way of example, other memory cells could be employed.

Figure 4:
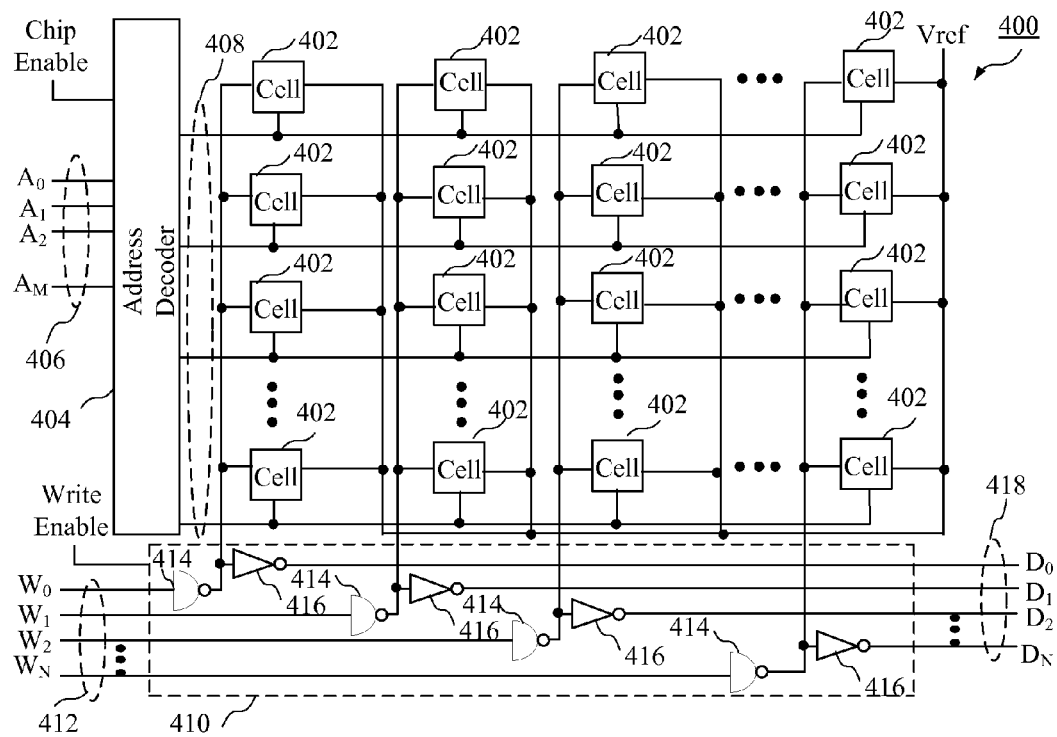
FIG. 4 is a block diagram of a DRAM block.

Turning now to FIG. 4, a block diagram of a DRAM block is shown. The DRAM block of FIG. 4 could be a part of the external memory 104 or the internal memory 120, as will be described in more detail below. The DRAM block 400 comprises a plurality of cells 402, each of which is coupled to an address decoder 404. The address decoder 404 receives address lines 406, and generates an address which is coupled to the plurality of memory cells 402 as is shown. The address decoder 404 receives a chip enable signal, and each of the memory cells 402 receives a reference voltage Vref. A write block 410 enables the reading of data from or the writing of data to the memory cells 402. In particular, data provided by way of data lines 412 are written to an address provided to an address decoder if a write enable signal provided to the write block 410 enables writing to the memory cells 402 by way of the gates 414. If the write enable signal is not enabling writing to the memory cells 402, data coupled to inverters 416 is generated on data lines 418. As will be described in more detail below, data stored in the cells of the DRAM block must be periodically refreshed to retain the data.

Figure 5:
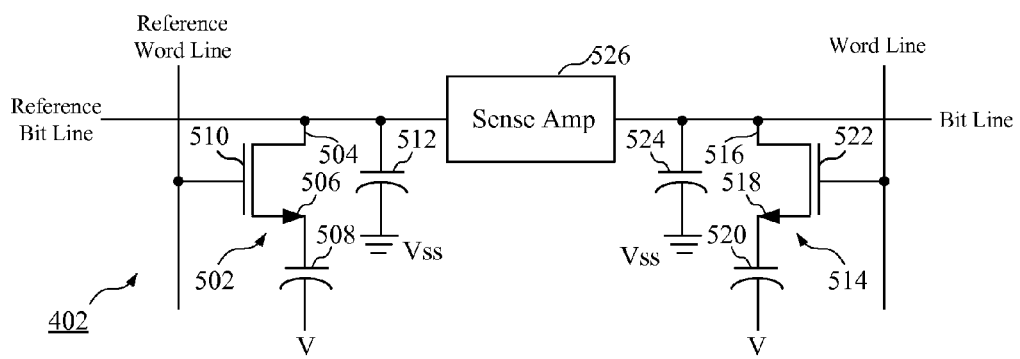
FIG. 5 is circuit diagram of a memory cell of the DRAM block of FIG. 4.

Turning now to FIG. 5, circuit diagram of a memory cell of the DRAM block of FIG. 4 is shown. In particular, a first transistor 502 has a drain 504 coupled to a reference bit line and a source 506 coupled to a capacitor 508. The transistor 502 is controlled at a gate by a reference word line. A second transistor 514 has a drain 516 coupled to a bit line and a source 518 coupled to a capacitor 520. The transistor 514 is controlled at a gate by a word line. Data is written by pulling the word line high, and applying the desired value to be stored to the bit line to charge the capacitor 520. In order to read data from the memory, the sense amp 526 will detect a difference between the voltage stored on the capacitor 512 at the reference bit line and the voltage stored on the capacitor 524 at the bit line to generate an output value. After the value of the bit line is determined, that value is re-written to the bit line by storing the appropriate charge on the capacitor 524. That is, the capacitor 524 is periodically recharged to maintain the correct value of data stored by the cell. While an individual DRAM memory cell is beneficial because it is smaller than the SRAM cell of FIG. 3, the DRAM memory cell must be periodically refreshed to maintain the charge on the capacitor representing the stored data and may have a longer access time than the SRAM cell.

Figure 6:
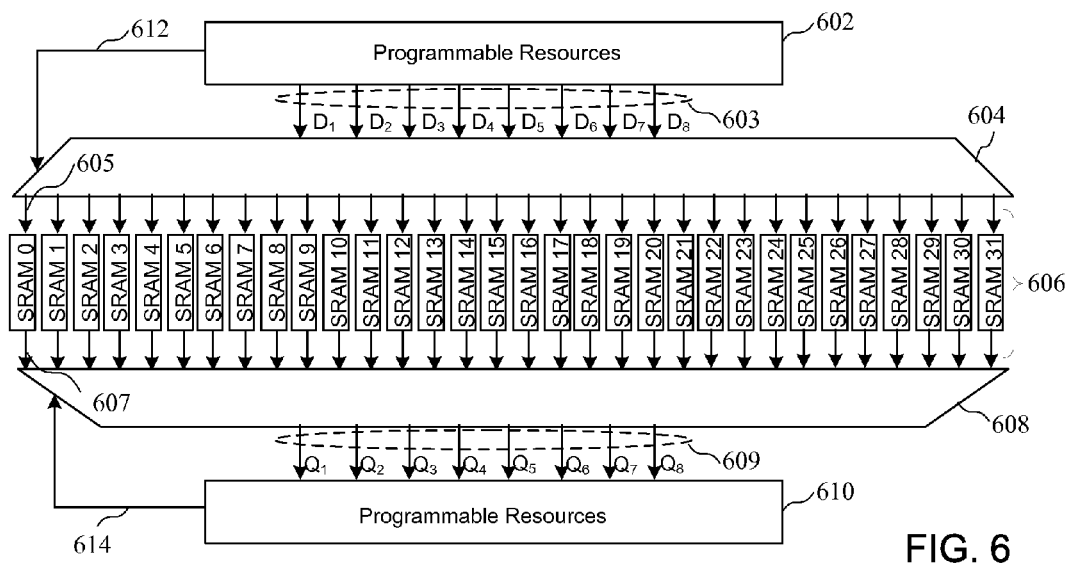
FIG. 6 is a block diagram of a portion of an integrated circuit device having a plurality of SRAM blocks.

Turning now to FIG. 6, a block diagram of a portion of an integrated circuit device having a plurality of SRAM blocks is shown. A portion 602 of programmable resources is coupled by data lines 603 to a routing circuit 604 which provides an interface to a plurality of memory blocks 606. The plurality of memory blocks are shown here by way of example as 32 SRAM blocks. The routing circuit 604 is preferably dedicated interconnect elements for the plurality of memory blocks 606. The routing circuit 604 enables routing data to U input ports of the routing circuit (shown here as 8 data input ports coupled to corresponding data lines $D_1$-$D_8$) and V output ports (where V may be 32 as shown here for example), where each of the input and output ports may have W bits per port. That is, each individual input port of the routing circuit 604 corresponding to a data line may receive 288-bit data (which may 256 bit data and 32 overhead bits), and each output port may generate 288-bit data. For example, a representative one of the output ports is coupled by a corresponding data line 605 to an input of a first memory block designated SRAM 0. Therefore, data $D_1$-$D_8$ from each of the eight 288-bit input ports may be routed to one or more of 32 memory blocks by way of 32 288-bit output ports of the routing circuit 604. It should be understood that the data provided to the plurality of memory blocks according to the circuit arrangement of FIG. 6 could include data bits and control bits, where the control bits may include address bits for example.

A second routing circuit 608 is coupled to outputs of the plurality of memory blocks 606 to receive data generated by the plurality of memory blocks. An output of SRAM 0 at a corresponding representative data line 607 is coupled to an input of the routing circuit 608. Output data lines 609 of the routing circuit 608 are coupled between corresponding output ports of the routing circuit 608 and a second portion 610 of programmable resources. The routing circuits 604 and 608 could be implemented as a synchronous crossbar switch, as will be described in more detail in reference to FIG. 15, and are preferably implemented as dedicated interconnect elements, rather than using shared routing elements which could be used by circuits other than the specific portions 602 and 610 of programmable resources. The output data lines 609 could also be multi-bit lines (e.g. 8 bit lines) which are coupled to receive corresponding 8-bit outputs at the outputs of the plurality of memory elements. Accordingly, the 8-bit outputs $Q_1$-$Q_8$ of 8 of the 32 SRAMS could be generated at the 8 output data lines 609 of the routing circuit 608. A control line 612 is used to route the various inputs to the routing circuit 604 to first predetermined memory blocks of the plurality of memory blocks 606. Similarly, a control line 614 is used to route outputs of second predetermined memory blocks to the 8 outputs ports of the routing circuit 608 and to the portion 610 of the programmable resources. By providing dedicated routing circuits and dedicated interconnects as inputs and outputs to the circuit, the speed of the SRAM access can be increased. That is, shared interconnect routing for a programmable logic device, while providing greater flexibility for the device, can be slow. In contrast, dedicated routing circuits, such as a crossbar switch, can operate at a system clock for the integrated circuit.

Figure 7:
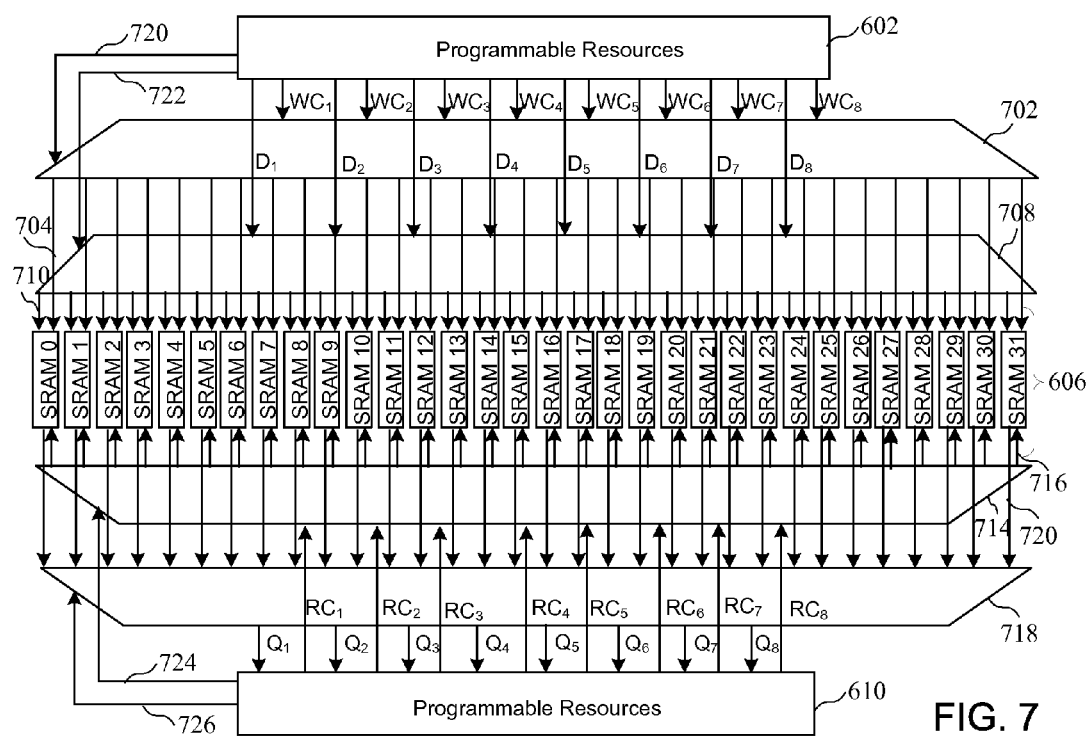
FIG. 7 is a block diagram of a portion of an integrated circuit device coupled to a plurality of SRAM blocks and having separate read and write control.

Turning now to FIG. 7, a block diagram of a portion of an integrated circuit device coupled to a plurality of SRAM blocks and having separate read and write control is shown. That is, the arrangement of FIG. 7 enables the separate routing of data bits and control bits by way of separate routing circuits, where the control bits include separate read and write control bits, including address bits for example. In particular, a routing circuit 702 is coupled to receive write control signals $WC_1$-$WC_8$ from the programmable resources 602, where a representative one of a plurality of output ports of the routing circuit 702 is coupled by a control line 704 to a corresponding control signal input of a memory element of the plurality of memory elements 706, designated here as SRAM 0. Another routing circuit 708 is coupled to receive data inputs $D_1$-$D_8$ at input ports of the routing circuit 708. Output ports of the routing circuit 708, shown here by a representative data line 710 of a plurality of data lines at corresponding output ports, are coupled to a first memory block, designated here as SRAM 0. Accordingly, the routing circuit 702 enables routing any pair of data and control signals to data and control inputs of one or more selected memory elements of the plurality of memory elements 606.

Routing circuits are also provided to read data from the plurality of memory blocks. A routing circuit 714 is coupled to receive control signals from the portion 610 of the programmable resources, including read control signals $RC_1$-$RC_8$. The routing circuit 714 enables routing the read control signals to selected memory blocks, where an output port of the routing circuit 714 is coupled by a control line to a memory (shown here as a representative control line 716 coupled to the last memory block, designated here as SRAM 31). A routing circuit 718 is coupled to receive outputs from the plurality of memories 720, where a representative data line 720 provides data from an output of the last memory block to an input of the routing circuit 718. The data $Q_1$-$Q_8$ provided by the memory blocks 706 is provided by one of the eight outputs lines from the routing circuit 718 to the programmable resources 610. Control signals are provided by the programmable resources to the routing circuits. More particularly, write control signals are provided by programmable resources 602, by way of control lines 720 and 722, to the routing circuits 702 and 708, respectively, while read control signals are provided by the programmable resources 610, by way of 724 and 726, to the routing circuits 714 and 718, respectively. Alternatively, control signals may be provided by another element of the circuit, such as a processor of the circuit.

Figure 8:
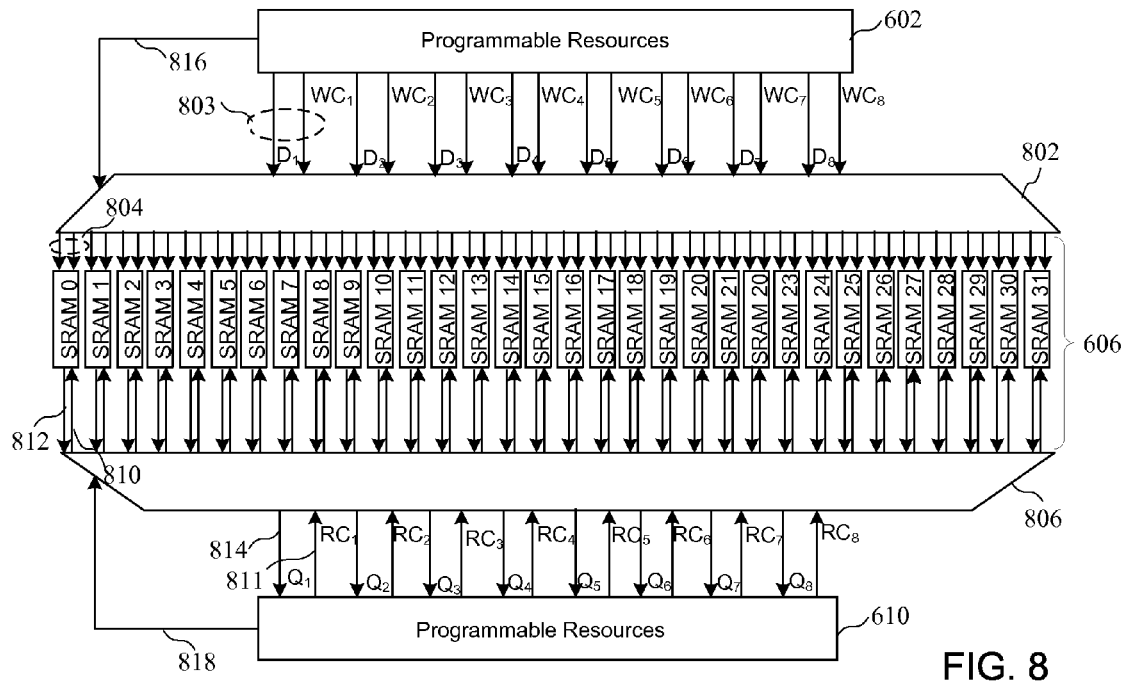
FIG. 8 is a block diagram of a portion of an integrated circuit device having a plurality of SRAM blocks having data and read and write control associated with a single crossbar switch.

Turning now to FIG. 8, a block diagram of a portion of an integrated circuit device comprising a plurality of SRAM blocks having data and read and write control associated with a single crossbar is shown. Accordingly, both data $D_1$-$D_8$ and write control signals $WC_1$-$WC_8$ are provided to the routing circuit 802. For example, data $D_1$ and write control signals $WC_1$ are provided to the routing circuit 802 by representative signal line pair 803. The signals on the signal line pair at corresponding input ports of the routing circuit 802 are then provided to a selected memory element (which could be, by way of example, SRAM 0) by signal line pair 804. Read control signals $RC_1$-$RC_8$ are generated by the programmable resources 610 and coupled by control signal lines between the programmable resources 610 and the plurality of memory elements 706. By way of example, a representative control signal line 810 couples a selected read control signal (which could be read control signal $RC_1$ provided by way of read control line 811 between an output port of the programmable resources 806 and an input port of the routing circuit 806) to a read input of SRAM 0, and an output signal line 812 coupled to a data output of the SRAM 0 enables data from the SRAM 0 to be coupled to the programmable resources by way of the routing circuit 806. For example, the output data provided on output signal line 812 may be $Q_1$ which is routed by the routing circuit 806 on a signal line 814 between an output port of the routing circuit 806 and a corresponding input port of the programmable resources 610. Control signals are provided by control signal lines 816 and 818 to the routing circuits 802 and 806, respectively, to control reading data.

Figure 9:
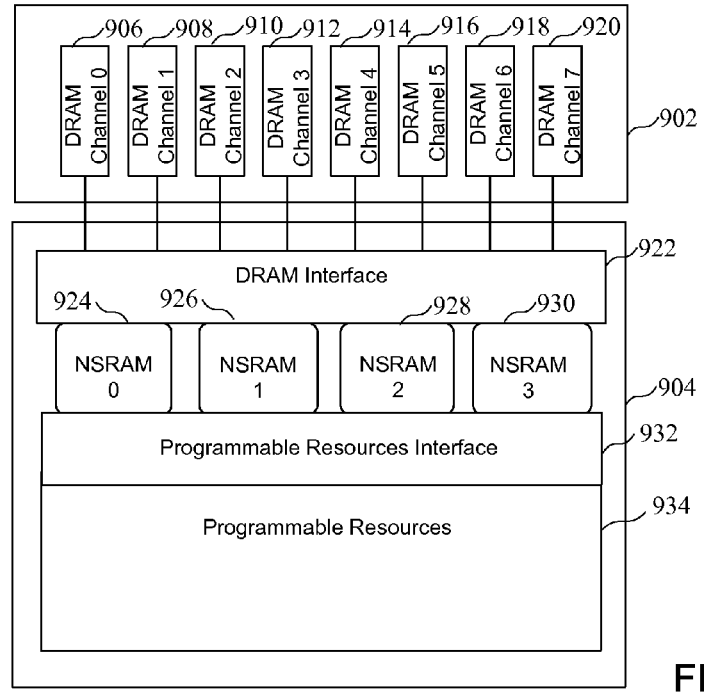
FIG. 9 is a block diagram of an integrated circuit device having a plurality of SRAM blocks and a DRAM block.

Turning now to FIG. 9, a block diagram of an integrated circuit device having a plurality of SRAMs and a DRAM is shown. According to the circuit arrangement of FIG. 9, a DRAM 902 is coupled to an integrated circuit 904. The DRAM 902 comprises output channels 906-920, designated DRAM Channel 0-DRAM Channel 7. A DRAM interface 922 enables data provided to the integrated circuit 904 to be routed to one of a plurality of memory blocks 924-930, shown here as networked SRAMs (NSRAM 0-NSRAM 3) which could be 4.5 megabyte memory arrays. That is, each of the networked SRAMs (NSRAM0-NSRAM3) could comprise 32 4K×288 bit SRAMS, such as SRAMs 606. While the plurality of memory blocks 924-930 are shown as SRAMs, it should be understood that the plurality of memory blocks 924-930 generally have faster access time than the DRAM 902. For example, the memory blocks 924-930 could be eDRAMs, available from International Business Machines Corporation of Armonk, N.Y. A programmable resource interface 932 is provided between the plurality of memory blocks 924-930 and programmable resources 934 to enable data and commands to be transferred between the memory blocks and the programmable resources 934. The DRAM interface 922 and the programmable resources interface 932 are preferably dedicated interfaces, and could also be implemented using a crossbar switch, such as the crossbar switch of FIG. 15. The plurality of memory blocks 924-930 and the corresponding interfaces 922 and 932 could be implemented according to the circuits of FIGS. 6-8, for example. While the DRAM 902 is shown separate from the integrate circuit 904, it should be understood that the DRAM could be implemented on the same integrated circuit die, or on a separate die on the same integrated circuit package, as will be described in more detail in reference to FIG. 19.

The arrangement of FIG. 9 is beneficial because it allows greater efficiency in implementing memory in an integrated circuit. For example, without 100 Mb of additional caching SRAMs on-die (such as SRAMs 924-930), the integrated circuit device 904 could not support 400 Gb/s packet buffering with bandwidth guarantee for up to 300 logical queues. These SRAM blocks must be on-die because there are insufficient package I/O pins in conventional devices to support the required bandwidth for external SRAM. Further, the SRAM width is matched to DRAM channel width (e.g. 256 bits per cycle), and the SRAM depth is sized to allow flexible allocation of memory capacity to memory ports by combining multiple such SRAMs into an even larger memory. For instance, with 1 Mb building block SRAMs, 2 Mb can be allocated to one cache and 10 Mb can be allocated to a different cache. Too shallow of a building-block SRAM results in less density (i.e. bits per unit area), while too deep of a building-block SRAM limits flexibility for allocating memory capacity to memory ports. Particular applications of the circuit arrangements of FIG. 9 will be provided in FIGS. 10-14.

Figure 10:
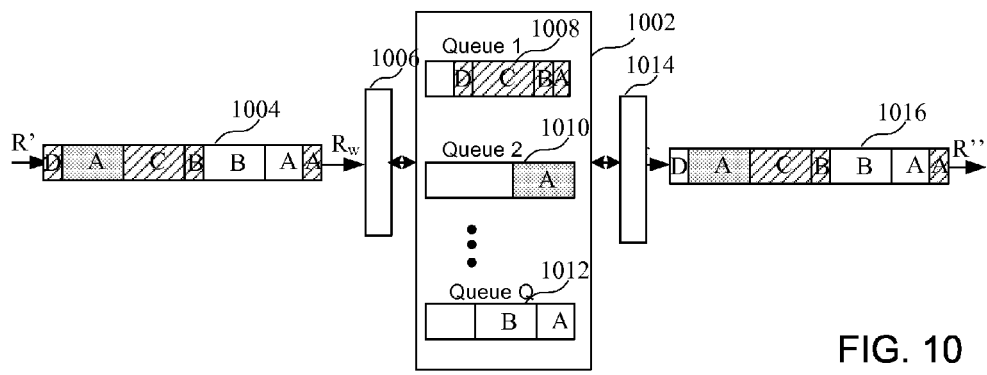
FIG. 10 is a block diagram showing a circuit enabling the storage of data in queues of a DRAM.

Turning now to FIG. 10, a block diagram shows a circuit enabling the storage of data in queues of a DRAM. An input data stream having data from a plurality of data packets is stored in a memory element 1002, which may comprise a plurality of logical FIFOs for example. A routing circuit 1006 coupled to an output of the memory element 1004 enables routing of data associated with the data packets to corresponding queues 1008-1010 as shown. A second routing circuit 1014 routes data from outputs of the queues 1008-1010 to a memory element 1016. Accordingly, the circuit of FIG. 10 enables reading data from and writing data to a bulk storage element (e.g. memory element 1002), which could be a DRAM for example, using dedicated routing circuits to enable the multiplexing of data, where the memory element 1002 could be DRAM 902 and memory elements 1004 and 1016 could be two or more of the SRAMs 924-930.

By way of example, the circuits of FIGS. 6-9 (implemented as shown in FIG. 10) could be used as a packet buffer (between and input data stream and an output data stream) to hold Q logical flows of packets for up to $T_c$ seconds at an input line rate of R' using a DRAM with a peak bandwidth of $R_a$, where a read rate $R_w$ and write rate $R_r$ have a combined $(R_w+R_r)$ which is less than a peak bulk storage bandwidth $R_a$ and a bulk storage capacity of $T_cR'$. Accordingly, a buffer read rate of R" can be sustained with zero packet drop. As is apparent from FIG. 10, memory blocks, shown here as queues, can be used to enable data from different packets (for example, the cross-hatched data in Queue 1, the shaded data in Queue 2, or the unshaded data in Queue 3) to be stored, where routing circuits enable the routing of data from an input data stream to the bulk storage device, and from the bulk storage device to an output data stream.

Figure 11:
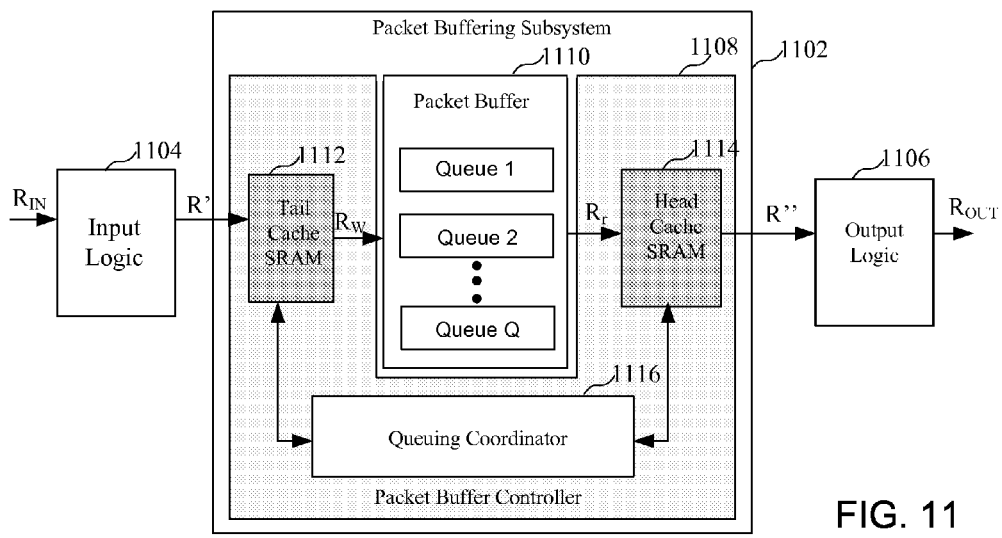
FIG. 11 is a block diagram showing a more detailed circuit enabling a packet buffering subsystem.

Turning now to FIG. 11, a block diagram shows a more detailed circuit enabling a packet buffering subsystem. More particularly, the packet buffering subsystem 1102 is coupled to input logic 1104 for receiving input data $R_{in}$ and output logic for generating output data $R_{out}$. The packet buffering subsystem 1102 comprises a packet buffer 1110 which is coupled to a packet buffer controller 1108. The packet buffer 1110 may be a DRAM, for example. The packet buffer controller 1108 comprises a tail cache SRAM 1112 and a head cache SRAM 1114 which are controlled by a queuing coordinator 1116. Tail-head caching will be described in more detail below in reference to FIGS. 12 and 13, and the queuing coordinator 1116 will enable bypass of the DRAM will be described in more detail in reference to FIG. 14.

Figure 12:
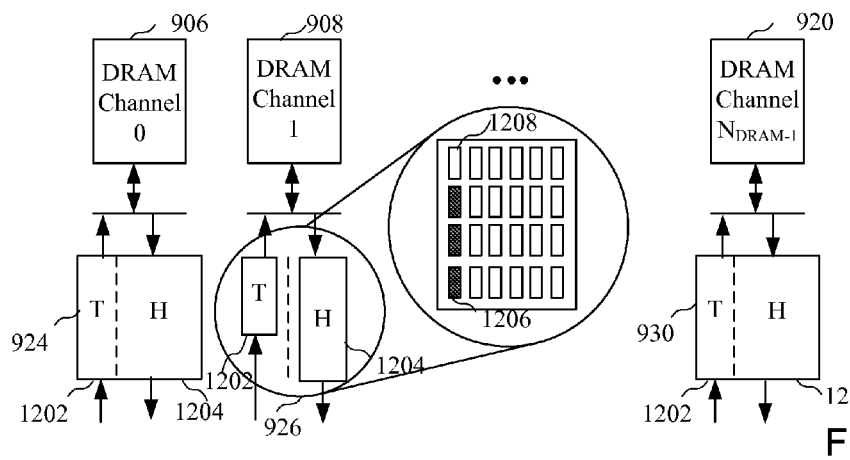
FIG. 12 is a block diagram showing the implementation of SRAM blocks using different size memory arrays for head and tail portions.

Turning now to FIG. 12, a block diagram shows the implementation of SRAM blocks using different size memory arrays for head and tail portions. In particular, various DRAM channels including DRAM channel 906, 908, and 920 coupled to corresponding memory block 924, 926 and 930 are shown. The memory blocks 924, 926 and 930 are partitioned with separate tail portions 1202 and head portions 1204, where the tail portion is generally smaller than the head portion. That is, because it may not be predictable when a queue is going to be accessed, and a next read may be for a queue which is being filled, it is necessary to make the head cache larger. As shown in the enlarged portion of memory block 926, certain memory elements 1206, designated by the dark shading, are memory elements for the tail caching, while the other unshaded memory elements 1208 are memory elements of the head caching. The head cache is often much larger than the tail cache to enable low latency.

Figure 13:
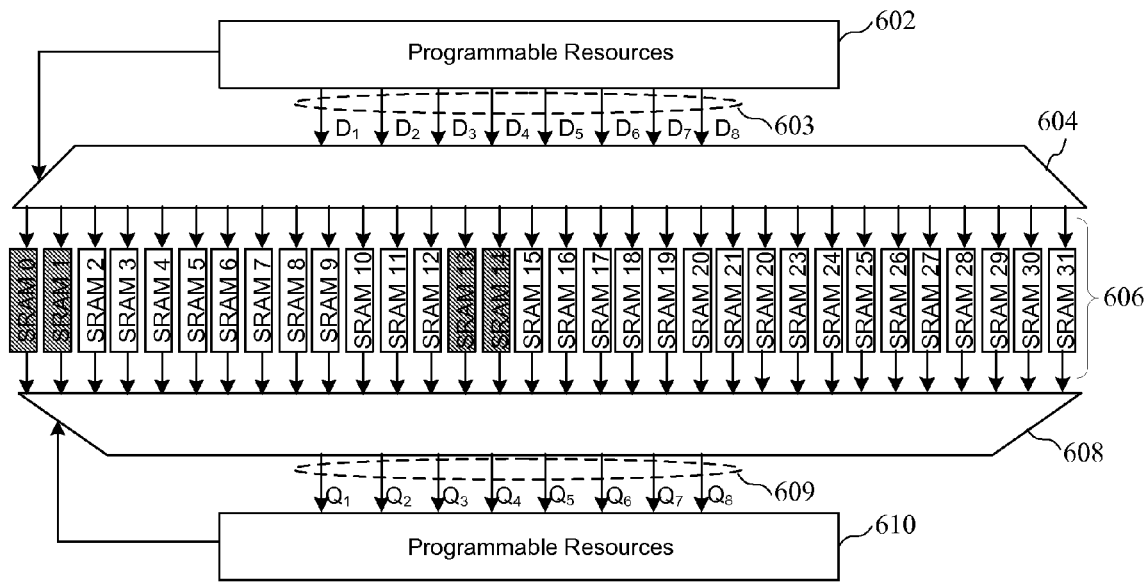
FIG. 13 is a block diagram showing the implementation of SRAM blocks having head and tail memory allocation.

Turning now to FIG. 13, a block diagram shows the implementation of SRAM blocks having head and tail memory allocation. According to the embodiment of FIG. 13, specific memory blocks, shown in dark shading, are designated as tail memory blocks, while the other memory blocks which are not shaded are head memory blocks. By way of example, SRAM 0 and SRAM 1 are tail caching memory blocks for channel 0, while SRAM 2-SRAM 12 are head caching memory blocks for channel 0, and SRAM 13 and SRAM 14 are tail memory blocks for channel 1, while SRAM 15-SRAM 24 are head memory blocks for channel 1.

Figure 14:
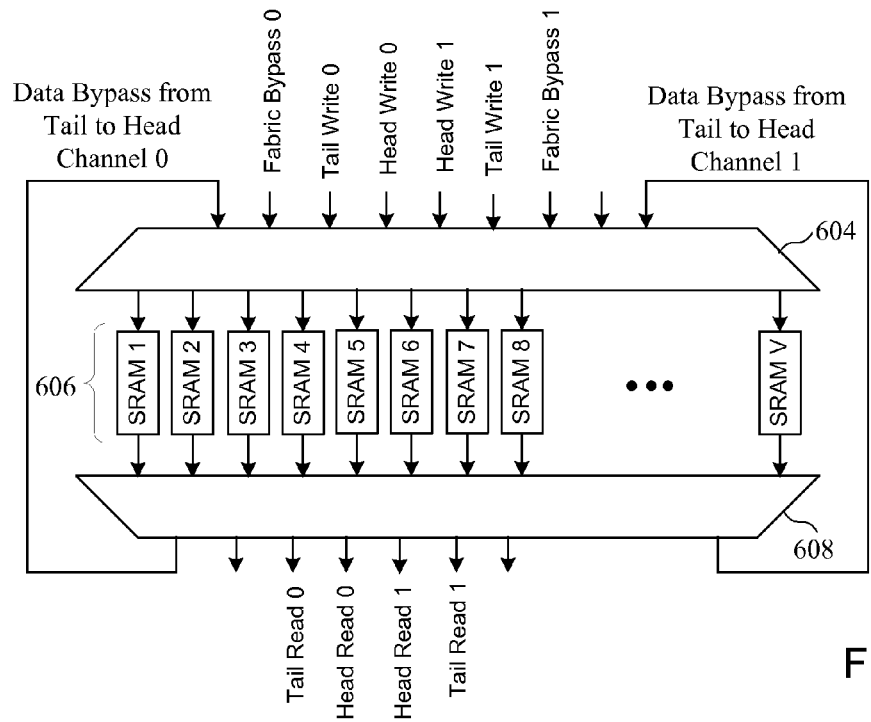
FIG. 14 is a block diagram showing the implementation of SRAM blocks having head and tail memory allocation and bypass channels.

Turning now to FIG. 14, a block diagram shows the implementation of SRAM blocks having head and tail memory allocation and bypass channels. In particular, various write signals for each of channel 1 and channel 2 include a tail write command (Tail Write 0) and a head write command (Head Write 0) for channel 0 and a tail write command (Tail Write 1) and a head write command (Head Write 1) for channel 1. Also shown are tail read (Tail Read 0) and head read (Head Read 0) values for channel 0, and tail read (Tail Read 1) and head read (Head Read 1) values for channel 1. Bypasses are provided from the tail memory elements to the head memory elements for each of channel 1 and channel 2. Accordingly, FIG. 14 provides an example implementation of tail-head caching using the arrangement of elements of FIGS. 6-13, for example.

Figure 15:
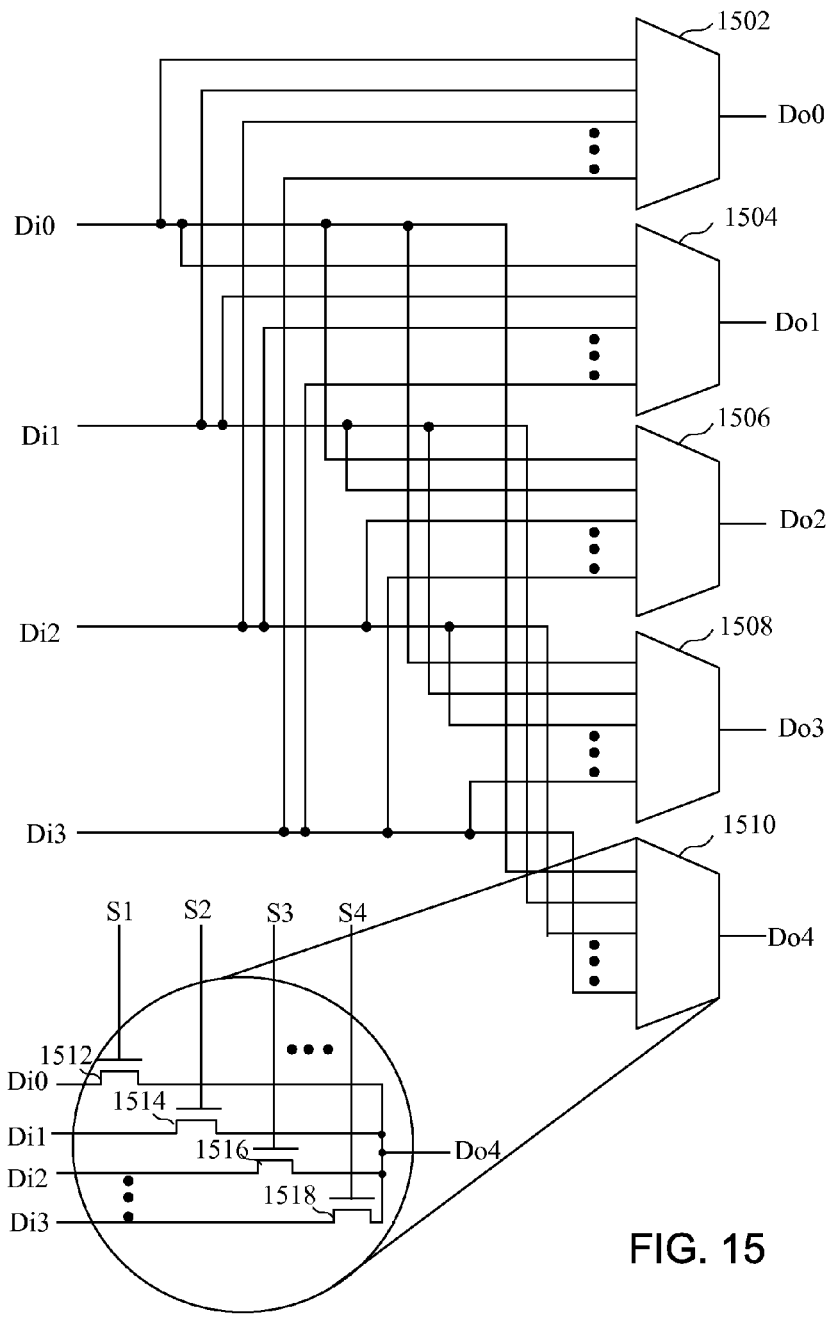
FIG. 15 is a block diagram of a crossbar switch.

Turning now to FIG. 15, a block diagram of a crossbar switch is shown. In particular, each multiplexer of a plurality of multiplexers 1502-1510 is coupled to receive each of the inputs, designated Di0-Di3, and generate an output for each of the multiplexers. Multiplexer 1502 generates an output Do0, multiplexer 1504 generates an output Do1, multiplexer 1506 generates an output Do2, multiplexer 1508 generates an output Do3, multiplexer 1510 generates an output Do4 based upon selection signals provided to the plurality of multiplexers. An enlarged section of multiplexer 1510 shows transistors 1512 to 1518 coupled to the inputs for receiving signals Di0-Di3, respectively, to an output signal Do4 at a common node based upon the selection signals S1-S4. While the multiplexer arrangement of FIG. 15 is shown by way of example, it should be understood that other arrangements of transistors could be implemented to achieve the multiplexing functionality. As is apparent from FIG. 15, the crossbar switch could be selected to route a given number of signals to a fewer number of outputs or a given number of signals to a greater number of outputs. Further, the selection signal of the crossbar switch can be dynamically changed, in contrast to multiplexer control signals for general programmable interconnects of a programmable logic device which must be provided as configuration data and changed by a configuration process. Accordingly, the crossbar switch of FIG. 15 could be used for any of the routing circuits of FIGS. 6-14, or any other circuit set forth above which could be implemented in a crossbar switch.

Figure 16:
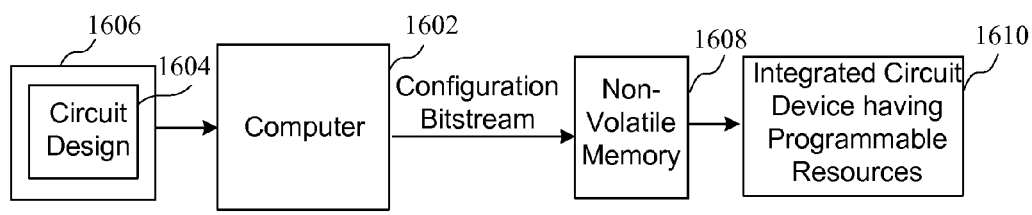
FIG. 16 is a block diagram of a system for programming a device having programmable resources.

Turning now to FIG. 16, a block diagram of a system for programming a device having programmable resources according to an embodiment is shown. In particular, a computer 1602 is coupled to receive a circuit design 1604 from a memory 1606, and generate a configuration bitstream which is stored in the non-volatile memory 1606. As will be described in more detail below, the circuit design may be a high level design, such as a circuit design defined in a hardware description language (HDL). Also, the computer may be configured to run software that generates a configuration bitstream which is stored in the non-volatile memory 1608 and provided to an integrated circuit 1610 which may be a programmable integrated circuit, such as the integrated circuit described below in FIG. 17.

Figure 17:
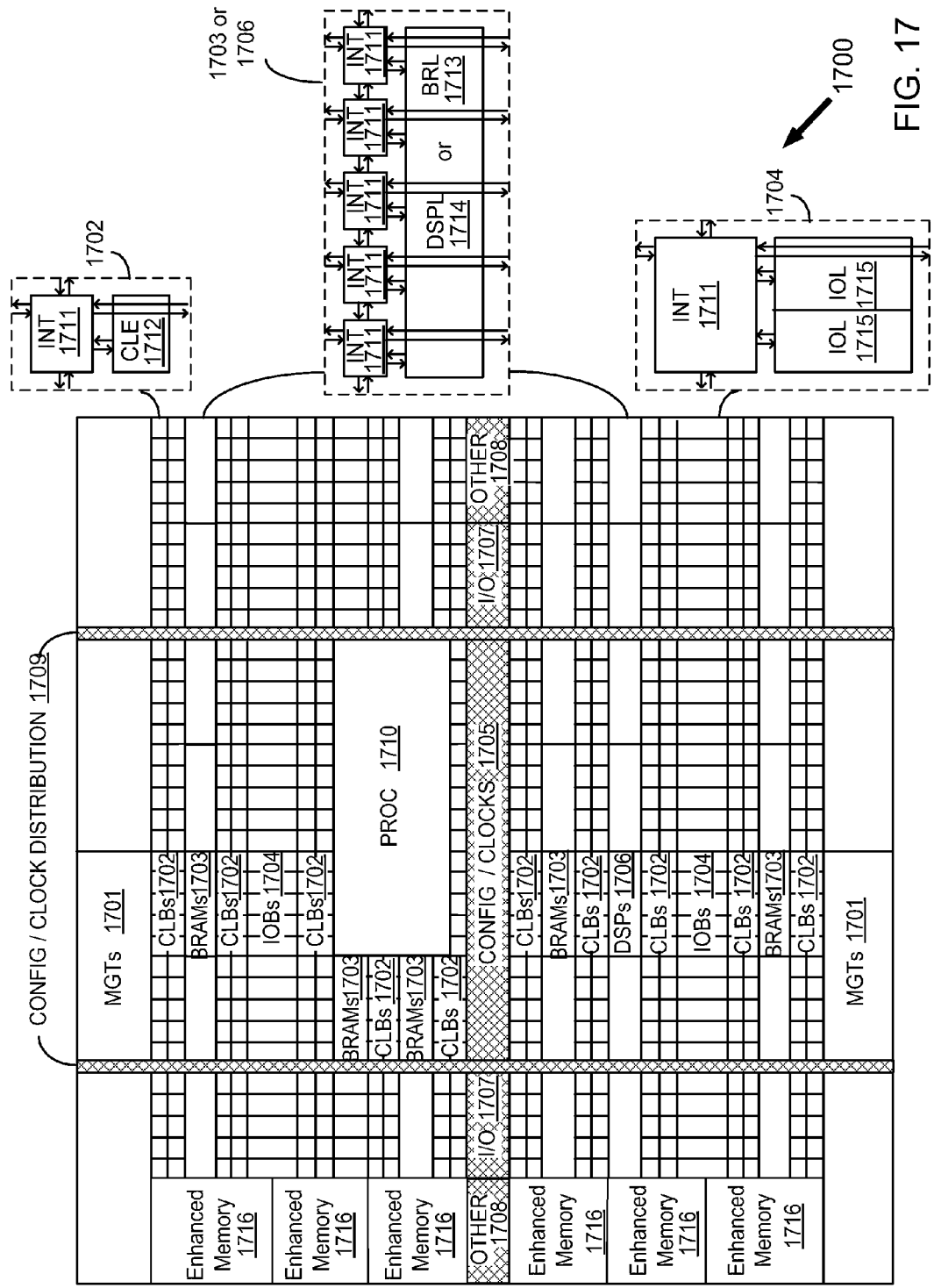
FIG. 17 is a block diagram of a device having programmable resources which may implement the circuits of FIGS. 1-15.

Turning now to FIG. 17, a block diagram of a device having programmable resources including the circuits of FIGS. 2-16 is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 17 comprises an FPGA architecture 1400 having a large number of different programmable tiles including multi-gigabit transceivers (MGTs) 1701, CLBs 1702, random access memory blocks (BRAMs) 1703, input/output blocks (IOBs) 1704, configuration and clocking logic (CONFIG/CLOCKS) 1705, digital signal processing blocks (DSPs) 1706, specialized input/output blocks (I/O) 1707 (e.g., configuration ports and clock ports), and other programmable logic 1708 such as digital clock managers, analog-to-digital converters, system monitoring logic, and so forth. Some FPGAs also include dedicated processor blocks (PROC) 1710, which may be used to implement a software application, for example.

In some FPGAs, each programmable tile includes a programmable interconnect element (INT) 1711 having standardized connections to and from a corresponding interconnect element in each adjacent tile. Therefore, the programmable interconnect elements taken together implement the programmable interconnect structure for the illustrated FPGA. The programmable interconnect element 1711 also includes the connections to and from the programmable logic element within the same tile, as shown by the examples included at the top of FIG. 17.

For example, a CLB 1702 may include a configurable logic element (CLE) 1712 that may be programmed to implement user logic plus a single programmable interconnect element 1711. A BRAM 1703 may include a BRAM logic element (BRL) 1713 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 1706 may include a DSP logic element (DSPL) 1714 in addition to an appropriate number of programmable interconnect elements. An IOB 1704 may include, for example, two instances of an input/output logic element (IOL) 1715 in addition to one instance of the programmable interconnect element 1711. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. The config/clock distribution regions 1409 extending from this column are used to distribute the clocks and configuration signals across the breadth of the FPGA. Some FPGAs utilizing the architecture illustrated in FIG. 17 include additional logic blocks that disrupt the regular columnar structure making up a large part of the FPGA. The additional logic blocks may be programmable blocks and/or dedicated logic. For example, the processor block PROC 1710 shown in FIG. 17 spans several columns of CLBs and BRAMs.

The FPGA of FIG. 17 further comprises enhanced memory elements 1716 which are larger than the BRAMs 1703. The enhanced memory elements 1716 may comprise an SRAM block and dedicated interconnect elements, separate from the various interconnect elements described in reference to blocks of the circuit 1700, enabling access to memory elements of the enhanced memory elements by blocks of the circuit 1700 or devices external to the circuit 1700.

Note that FIG. 17 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 17 are purely exemplary. For example, in an actual FPGA more than one adjacent column of CLBs is typically included wherever the CLBs appear in order to facilitate the efficient implementation of user logic. While the embodiment of FIG. 17 relates to an integrated circuit having programmable resources, it should be understood that the circuits and methods set forth in more detail below could be implemented in any type of ASIC.

Accordingly, the arrangement of elements of FIG. 17 partitions SRAMS into two groups, including BRAMs which may be 36 Kbyte memory elements, and the enhanced memory elements 1716 comprise blocks of memory which are larger than the BRAMs, and may be 36 Mb, for example. By providing the deeper memories of the enhanced memory elements 1716, more bits are provided per unit area, and there is no need to cascade multiple BRAMS to achieve a larger memory. The enhanced memory elements 1716 could be implemented using the arrangement of memory elements and dedicated routing interconnect elements as set forth above, and more particularly as shown in FIGS. 6-8 or the arrangements of FIGS. 6-8 as implemented in FIG. 9.

Figure 18:
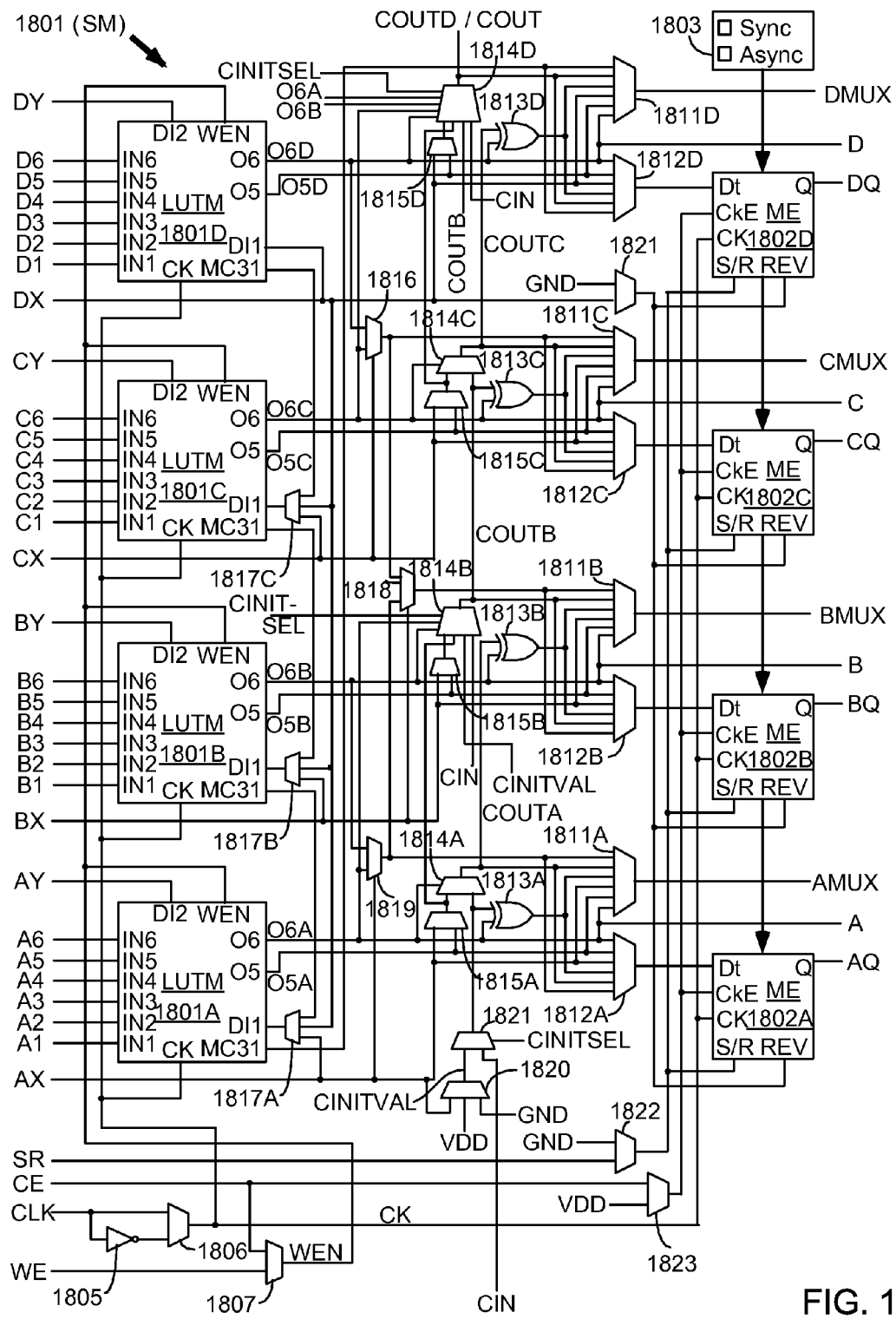
FIG. 18 is a block diagram of a configurable logic element of the device of FIG. 17.

Turning now to FIG. 18, block diagram of a configurable logic element of the device of FIG. 17 is shown. In particular, FIG. 18 illustrates in simplified form a configurable logic element of a configuration logic block 1702 of FIG. 17. In the embodiment of FIG. 18, slice M 1801 includes four lookup tables (LUTMs) 1801A-1801D, each driven by six LUT data input terminals A1-A6, B1-B6, C1-C6, and D1-D6 and each providing two LUT output signals O5 and O6. The O6 output terminals from LUTs 1801A-1801D drive slice output terminals A-D, respectively. The LUT data input signals are supplied by the FPGA interconnect structure via input multiplexers, which may be implemented by programmable interconnect element 1811, and the LUT output signals are also supplied to the interconnect structure. Slice M also includes: output select multiplexers 1811A-1811D driving output terminals AMUX-DMUX; multiplexers 1812A-1812D driving the data input terminals of memory elements 1802A-1802D; combinational multiplexers 1816, 1818, and 1819; bounce multiplexer circuits 1822-1823; a circuit represented by inverter 1805 and multiplexer 1806 (which together provide an optional inversion on the input clock path); and carry logic having multiplexers 1814A-1814D, 1815A-1815D, 1820-1821 and exclusive OR gates 1813A-1813D. All of these elements are coupled together as shown in FIG. 18. Where select inputs are not shown for the multiplexers illustrated in FIG. 18, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 18 for clarity, as well as from other selected figures herein.

In the pictured embodiment, each memory element 1802A-1802D may be programmed to function as a synchronous or asynchronous flip-flop or latch. The selection between synchronous and asynchronous functionality is made for all four memory elements in a slice by programming Sync/Asynch selection circuit 1803. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1802A-15802D are clocked by a clock signal CK, which may be provided by a global clock network or by the interconnect structure, for example. Such programmable memory elements are well known in the art of FPGA design. Each memory element 1802A-1802D provides a registered output signal AQ-DQ to the interconnect structure. Because each LUT 1801A-1801D provides two output signals, O5 and O6, the LUT may be configured to function as two 5-input LUTs with five shared input signals (IN1-IN5), or as one 6-input LUT having input signals IN1-IN6.

In the embodiment of FIG. 18, each LUTM 1801A-1801D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1817A-1817C for LUTs 1801A-1801C), or to the two 32-bit RAMs via input terminals DI1 and DI2. RAM write operations in the LUT RAMs are controlled by clock signal CK from multiplexer 1806 and by write enable signal WEN from multiplexer 1807, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1801A may also be provided to the general interconnect structure for shift register chaining, via output select multiplexer 1811D and CLE output terminal DMUX. Accordingly, the circuits and methods set forth above may be implemented in a device such as the devices of FIGS. 17 and 18, or any other suitable device.

Figure 19:
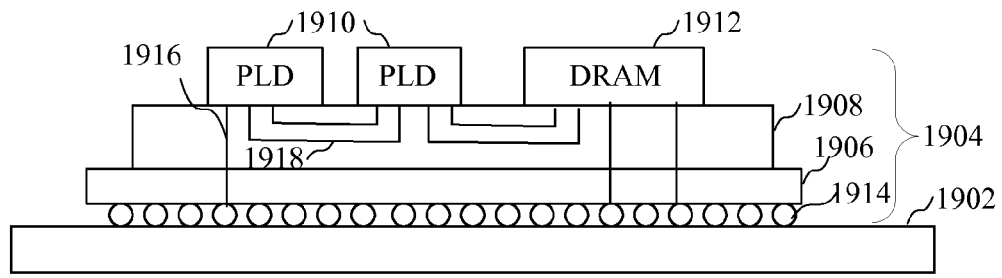
FIG. 19 is a block diagram of a multichip module integrated circuit device.

According to the embodiment of FIG. 19, a circuit board 1902, such as a printed circuit board, is configured to receive a multi-die integrated circuit 1904. The multi-die integrated circuit 1904 comprises a substrate 1906 coupled to receive an interposer circuit 1908. The interposer 1908 enables coupling multiple integrated circuit chips or die, such as FPGA chips 1910 and a DRAM chip 1912 circuits, to the substrate 1906. Solder balls 1914 enabling enable coupling signals from the various chips to the circuit board 1902 by way of various interconnects 1916, such as through silicon vias (TSVs). Interconnects 198 also enable the routing of signals between the various chips of the multi-die integrated circuit. The interposer circuit 1908 may be a silicon substrate with various metal layers comprising interconnect elements enabling the routing of signals between the FPGA chips and the DRAM chip or between one of the chips and the substrate 1906. However, the interposer circuit could be any material having conductive elements which enable routing signals as shown. While all of the circuits of the FPGA chips 1910 and the DRAM chip 1912 could be implemented on a single die, the embodiment of FIG. 19 enables more efficiently implementing the various circuits of FPGA chips 1910 and the DRAM chip 1912. For example, some circuits may be more efficiently implemented in an integrated circuit chip manufactured according to one process, such as a process forming transistors of a certain dimension, while other circuits may be implemented more efficiently in an integrated circuit chip manufactured according to another process. Accordingly, the arrangement of FIG. 19 could be used to implement the circuit of FIG. 9, where the DRAM 902 is implemented as DRAM 1912, and the plurality of memory elements 924-930 are implemented as SRAMs or EDRAMs in the substrate 1906. The DRAM interface 922 and the programmable resources interface 932 may be implemented on the substrate 1906 or as a part of the interposer 1908.

Figure 20:
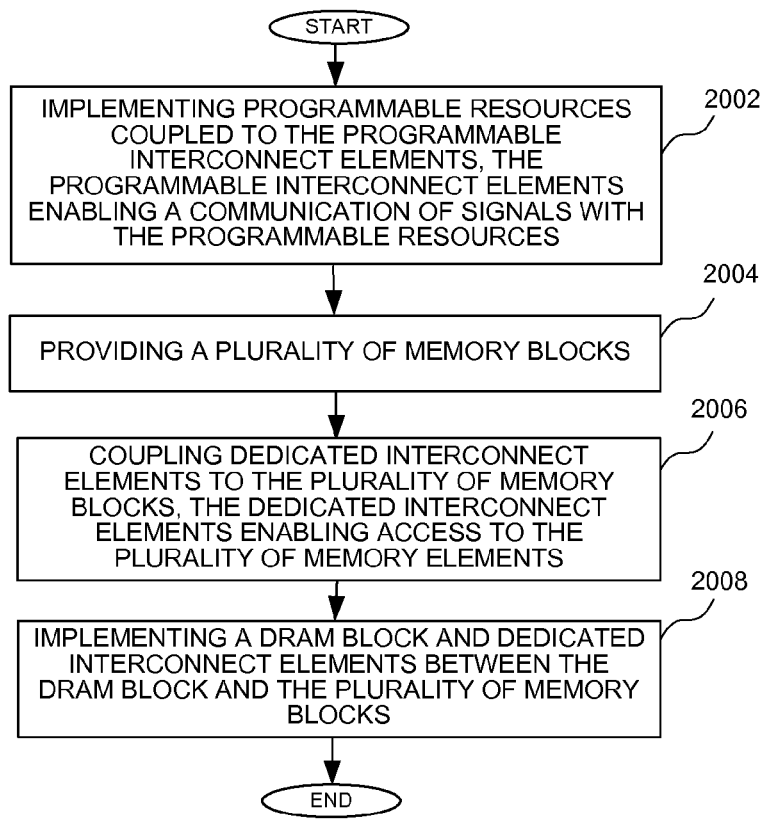
FIG. 20 is a flow chart showing a method of implementing memory in an integrated circuit device.

Turning now to FIG. 20, a flow chart shows a method of implementing memory in an integrated circuit device. In particular, programmable resources coupled to the programmable interconnect elements are implemented at a block 2002, wherein the programmable interconnect elements enable the communication of signals with the programmable resources. The programmable interconnects could be the interconnect elements associated with IOBs or CLEs of FIG. 17, for example. A plurality of memory blocks is provided at a block 2004, and dedicated interconnect elements are coupled to the plurality of memory blocks at a block 2006. The plurality of memory blocks may be the enhanced memory elements 1716 of FIG. 17, for example. A DRAM block may be implemented at a block 2008, where dedicated interconnect elements may be implemented between the DRAM block and the plurality of memory blocks. The various elements of the method of FIG. 20 may be implemented using the circuits of FIGS. 1-19 as described, or using some other suitable circuits. While specific elements of the method are described, it should be understood that additional elements of the method, or additional details related to the elements 2002-2008, could be implemented according to the disclosure of FIGS. 1-19.

It can therefore be appreciated that a new integrated circuit device having memory and method of implementing memory in an integrated circuit device has been described. It will be appreciated by those skilled in the art that numerous alternatives and equivalents will be seen to exist which incorporate the disclosed invention. As a result, the invention is not to be limited by the foregoing embodiments, but only by the following claims.

I claim:

1. An integrated circuit device having memory, the integrated circuit device comprising:
    programmable resources having at least a first portion and a second portion;
    programmable interconnect elements coupled to the programmable resources, the programmable interconnect elements enabling a communication of signals with the programmable resources;
    a plurality of memory blocks;
    a first dedicated interconnect element comprising an input interconnect element coupled to the plurality of memory blocks, the first dedicated interconnect element enabling the routing of data from the first portion of programmable resources to selected memory blocks of the plurality of memory blocks by first data lines; and
    a second dedicated interconnect element comprising an output interconnect element coupled to the plurality of memory blocks by second data lines, the second dedicated interconnect element enabling the routing of the data from the selected memory blocks to the second portion of programmable resources;
    wherein the programmable resources comprise a plurality of SRAM blocks each having a first size, and each memory block of the plurality of memory blocks is an SRAM block having a second size which is larger than the first size.

2. The integrated circuit device of claim 1 wherein the first and second dedicated interconnect elements comprise crossbar switches.

3. An integrated circuit device having memory, the integrated circuit device comprising:
    a DRAM block having a plurality of channels;
    a first portion of programmable resources comprising a first plurality of SRAM blocks;
    a plurality of memory blocks comprising a second plurality of SRAM blocks;
    a first dedicated interconnect element comprising an input interconnect element coupled between the DRAM block and the plurality of memory blocks by first data lines, the first dedicated interconnect element enabling routing data from any of the plurality of channels of the DRAM block to selected memory blocks of the plurality of memory blocks; and
    a second dedicated interconnect element comprising an output interconnect element coupled to the plurality of memory blocks by second data lines, the second dedicated interconnect element enabling the routing of the data from the selected memory blocks to a second portion of programmable resources;
    wherein each SRAM block of the first plurality of SRAM blocks has a first size, and each SRAM block of the second plurality of memory blocks has a second size which is larger than the first size.

4. The integrated circuit device of claim 3 wherein the first dedicated interconnect element comprises a first crossbar switch.

5. The integrated circuit device of claim 4 wherein the second dedicated interconnect element comprises a second crossbar switch.

6. The integrated circuit device of claim 5 wherein the second portion of programmable resources and the DRAM block are on a die of the integrated circuit device.

7. The integrated circuit device of claim 3 wherein the second portion of programmable resources are on a first die of the integrated circuit device and the DRAM block is on a second die of the integrated circuit device.

8. A method of implementing a memory in an integrated circuit device, the method comprising:
    implementing programmable resources coupled to programmable interconnect elements, the programmable interconnect elements enabling a communication of signals with the programmable resources;
    providing a plurality of memory blocks;
    coupling a first dedicated interconnect element comprising an input interconnect element to the plurality of memory blocks, the first dedicated interconnect element enabling the routing of data from a first portion of the programmable resources to selected memory blocks of the plurality of memory blocks by first data lines; and
    coupling a second dedicated interconnect element comprising an output interconnect element to the plurality of memory blocks by second data lines, the second dedicated interconnect element enabling the routing of the data from the selected memory blocks to the second portion of programmable resources;
    wherein implementing programmable resources comprises implementing a first plurality of SRAM blocks each having a first size, and providing a plurality of memory blocks comprises providing a plurality of SRAM blocks each having a second size which is larger than the first size.

9. The method of claim 8 wherein coupling a first dedicated interconnect element to the plurality of memory blocks comprises providing the first dedicated interconnect element separate from programmable interconnect elements.

10. The method of claim 8 wherein coupling a first dedicated interconnect element to the plurality of memory blocks comprises coupling a crossbar switch to the plurality of memory blocks.

11. The method of claim 8 further comprising implementing a DRAM block, wherein the first dedicated memory element is a crossbar switch coupled between the DRAM block and the plurality of memory blocks.

12. The method of claim 11 wherein implementing programmable resources comprises implementing programmable resources on a first die of the integrated circuit device and implementing a DRAM block comprises implementing a DRAM block on a second die of the integrated circuit device.

13. The integrated circuit device of claim 1 wherein the first dedicated interconnect element enables the routing of write control signals from the first portion of programmable resources to the plurality of memory blocks by first data lines.

14. The integrated circuit device of claim 1 further comprising a third dedicated interconnect element coupled to the plurality of memory blocks, wherein the third dedicated interconnect element enables the routing of write control signals to the plurality of memory blocks.

15. The integrated circuit device of claim 14 further comprising a fourth dedicated interconnect element coupled to the plurality of memory blocks, wherein the fourth dedicated interconnect element enables the routing of read control signals to the plurality of memory blocks.

16. The integrated circuit device of claim 3 further comprising a third dedicated interconnect element coupled to the plurality of memory blocks, wherein the third dedicated interconnect element enables the routing of write control signals to the plurality of memory blocks.

17. The integrated circuit device of claim 16 further comprising a fourth dedicated interconnect element coupled to the plurality of memory blocks, wherein the fourth dedicated interconnect element enables the routing of read control signals to the plurality of memory blocks.

18. The method of claim 8 wherein the first dedicated interconnect element enables the routing of write control signals from the first portion of programmable resources to the plurality of memory blocks by the first data lines.

19. The method of claim 8 further comprising coupling a third dedicated interconnect element coupled to the plurality of memory blocks, wherein the third dedicated interconnect element enables the routing of write control signals to the plurality of memory blocks.

20. The method of claim 19 further comprising coupling a fourth dedicated interconnect element coupled to the plurality of memory blocks, wherein the fourth dedicated interconnect element enables the routing of read control signals to the plurality of memory blocks.

* * * * *